United States Patent
Hore et al.

(10) Patent No.: US 9,859,591 B2
(45) Date of Patent: Jan. 2, 2018

(54) METHOD FOR OPERATING INTRINSICALLY SAFE BATTERY CELLS

(71) Applicant: Robert Bosch GmbH, Stuttgart (DE)

(72) Inventors: Sarmimala Hore, Stuttgart (DE); Hans Partes, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/126,601

(22) PCT Filed: Feb. 24, 2015

(86) PCT No.: PCT/EP2015/053798
§ 371 (c)(1),
(2) Date: Sep. 16, 2016

(87) PCT Pub. No.: WO2015/139922
PCT Pub. Date: Sep. 24, 2015

(65) Prior Publication Data
US 2017/0084964 A1 Mar. 23, 2017

(30) Foreign Application Priority Data
Mar. 18, 2014 (DE) ........................ 10 2014 204 953

(51) Int. Cl.
*H01M 10/42* (2006.01)
*H01M 10/48* (2006.01)
(Continued)

(52) U.S. Cl.
CPC ........ *H01M 10/48* (2013.01); *G01R 31/3606* (2013.01); *G01R 31/3627* (2013.01);
(Continued)

(58) Field of Classification Search
CPC .............. H01M 10/48; H01M 10/4257; G01R 31/3606
See application file for complete search history.

(56) References Cited

U.S. PATENT DOCUMENTS 7,982,437 B2   7/2011  To et al.
2014/0019449 A1   1/2014  Stimm
(Continued)

FOREIGN PATENT DOCUMENTS

CN   101097248   1/2008
CN   102666209   9/2012
(Continued)

OTHER PUBLICATIONS

International Search Report for Application No. PCT/EP2015/053798 dated May 7, 2015 (English Translation, 3 pages).
(Continued)

*Primary Examiner* — Stewart Fraser
(74) *Attorney, Agent, or Firm* — Michael Best & Friedrich LLP

(57) ABSTRACT

The invention relates to a method for operating intrinsically safe battery cells after charging of an intrinsically safe battery cell at a low temperature. In accordance with the invention, provision is made here for the determination of the discharge curve of the battery cell to then be performed, for the discharge curve of the battery cell to be analyzed in respect of the presence of plating criteria and for a change to operation in a monitoring mode to be made if at least one plating criterion is present, wherein the capacity of the intrinsically safe battery cell is monitored in the monitoring mode. The invention furthermore relates to an intrinsically safe battery cell which is designed for implementing the method.

10 Claims, 4 Drawing Sheets

(51) Int. Cl.
  *G01R 31/36* (2006.01)
  *H02J 7/00* (2006.01)
  *H01M 10/052* (2010.01)
  *H01M 10/0525* (2010.01)

(52) U.S. Cl.
  CPC ...... *G01R 31/3675* (2013.01); *H01M 10/425* (2013.01); *H01M 10/4257* (2013.01); *H01M 10/484* (2013.01); *H02J 7/0021* (2013.01); *H02J 7/0024* (2013.01); *H02J 7/0047* (2013.01); *H01M 10/052* (2013.01); *H01M 10/0525* (2013.01); *H02J 2007/005* (2013.01); *Y02T 10/7055* (2013.01)

(56) References Cited

U.S. PATENT DOCUMENTS

| | | | | |
|---|---|---|---|---|
| 2014/0091748 A1* | 4/2014 | Hermann | ........... | H02J 7/0075 320/103 |
| 2014/0093760 A1* | 4/2014 | Hermann | ........... | H02J 7/0075 429/66 |
| 2014/0120389 A1 | 5/2014 | Fink | | |

FOREIGN PATENT DOCUMENTS

| | | |
|---|---|---|
| CN | 102668315 | 9/2012 |
| CN | 103091641 | 5/2013 |
| CN | 103427123 | 12/2013 |
| DE | 102011113798 | 5/2012 |
| DE | 102011077311 | 12/2012 |
| DE | 102012212380 | 1/2014 |
| JP | 2010019664 | 1/2010 |
| KR | 1020090064774 | 6/2009 |
| WO | 2009036444 | 3/2009 |

OTHER PUBLICATIONS

Petzl et al., "Nondestructive detection, characterization, and commercial lithium-ion batteries", Journal of POW Sources, vol. 254, Dec. 20, 2013, pp. 80-87.

Smart et al., "Effects of Electrolyte Composition on Lithium Plating in Lithium-Ion Cells", Journal of the Electrochemical Society, Feb. 22, 2011, p. A379.

* cited by examiner

METHOD FOR OPERATING INTRINSICALLY SAFE BATTERY CELLS

BACKGROUND OF THE INVENTION

The invention relates to a method for operating intrinsically safe battery cells after charging of an intrinsically safe battery cell at a low temperature.

Battery cells are used in numerous ways in energy storage systems for stationary as well as mobile applications, such as, for example, in emergency power systems or in the automotive industry for electric and hybrid vehicles. In these applications, a plurality of battery cells are connected to one another in series and/or also in parallel to form battery modules and batteries.

Due to manufacturing tolerances and or age related losses of capacity, the capacity of the battery cells connected together to form batteries is not always exactly the same. Charging and discharging of the battery cells, however, typically occurs jointly in a composite, whereby there is, for example, the danger of overcharging or deep discharging individual battery cells. There is consequently the danger of overheating individual battery cells, which generally leads in multiple steps to a thermal destruction of the corresponding battery cell.

For this reason, there is a need to provide intrinsically safe battery cells which comprise safety components for the protection thereof. These include inter alia functions and devices such as safety switches CID (current interrupt device), valves for pressure relief or thermal protection devices against overheating due to overcharging or excessive current flow. In a simple case, an intrinsically safe battery comprises a switching device, with the help of which the intrinsically safe battery cell can be deactivated within the battery while the remaining battery cells of the battery can be further operated.

Intrinsically safe battery cells, such as intrinsically safe lithium ion cells, comprise in accordance with the prior art electronic components, such as, for example, a rapid discharging device in order to protect the battery cell in situations such as an internal or external short circuit, overcharging, deep discharging or external overheating.

Mechanisms that lead to an internal short circuit of a battery cell include plating. In this case, positively charged ions are not introduced into the structure of the electrode during the charging procedure but are deposited as a layer on said electrode. The layers of the deposits can lead to a short circuit between the electrodes. This effect can particularly occur when charging with very high currents or at low temperatures. Temperatures of approximately 0° Celsius and below are regarded here as low temperatures.

In this context, a rechargeable lithium cell comprising a reference electrode for monitoring the state of health thereof is know from the WIPO patent application WO 2009/036444 A2. The lithium cell comprises a battery management system including a state of charge monitor in order to obtain information in regard to a potential difference between the operating electrodes and the potential at one or a plurality of operating electrodes with respect to a reference electrode.

Furthermore, a battery control module is known from the U.S. Pat. No. 7,982,437 B2, which monitors discharge voltages that are associated with a traction battery of a vehicle. The battery control module operates the traction battery cyclically with a charging voltage-dependent charging/discharging profile in order to generate heat in the traction battery. If the temperature of the traction battery lies below a limit value, for example 10° C., the battery control module will operate the traction battery cyclically in order, for example, to generate heat during an early range of the vehicle operation at cold temperature conditions.

SUMMARY OF THE INVENTION

The charging of a battery cell, in particular a lithium ion cell, at low temperatures entails the risk of plating as well of the breakdown of the battery cell. When specifying an intrinsically safe battery cell, it is advantageous to recognize the development of plating in order to protect the battery cell as well as, if need be, the battery from further damage.

The subject matter of the invention is a method for operating intrinsically safe battery cells after charging of an intrinsically safe battery cell at a low temperature. The subject matter of the invention is furthermore an intrinsically safe battery cell that is designed for implementing the method.

According to the invention, provision is made for a method for operating intrinsically safe battery cells after charging an intrinsically safe battery cell at a low temperature. The method is characterized by the following steps: a determination of the discharge curve of the battery cell, an analysis of the discharge curve of the battery cell in respect of the presence of plating criteria and a change to an operation in a monitoring mode, in which the capacity of the battery cell is monitored, if at least one plating criterion is present.

The advantage of the invention is that an intrinsically safe battery cell, which is also referred to below as battery cell and is operated in accordance with the method according to the invention, can now be operated in a plurality of operating modes. Within the various operating modes, the battery cell is subjected to examinations of different intensity and thus efficiently serviced. In the case in which an inventive intrinsically safe battery cell has been subjected to the particular danger of plating due to charging at low temperatures, the discharge curve is determined during the subsequent discharging process.

According to the invention, this discharging process or respectively the effort for this discharging process must not be performed/made for each cycle but can be performed/made in an efficient manner only in the case where danger might occur to the cell.

In a further step, the discharge curve is examined after the presence of plating criteria. If no plating criteria are present, the battery cell continues to be operated in a normal mode. The parameters of the battery cell are typically monitored even in this normal mode; however, a discharge curve does not have to be determined.

Should, on the other hand, the presence of the plating criteria be established, the cell is then operated henceforth in a monitoring mode, in which the capacity of the battery cell is monitored. The advantage of the invention is that the monitoring is efficiently carried out only in the case in which a concrete reason is given. The monitoring of the capacity of the battery cell has the advantage that changes in the capacity can be determined which suggest the efficiency and operating safety of the cell and if need be allow for further measures to be taken. The method according to the invention thus contributes advantageously to an efficient increase in the operating safety in the sense of an intrinsically safe battery cell.

The method according to the invention advantageously comprises a further step in which, in the event that a rapid loss in capacity of the intrinsically safe battery cell is determined, a change is made to an operation in a safety mode, in which the intrinsically safe battery cell is deactivated. In so doing, the intrinsically safe battery cell is, for example, separated from a circuit arrangement connected to the intrinsically safe battery cell via an internal switching device. If the intrinsically safe battery cell is operated in a series circuit, a bypass is thus formed by the switching device.

In this case, a rapid loss of capacity is to be understood as a significant drop in the capacity of the battery cell from one cycle to the next or within a few cycles. The capacity of the battery cell normally drops by 0.1% to 1% with the first 50 to 100 cycles. This corresponds to an average gradient between 0.01% and 0.2% per cycle. If this gradient climbs by 10 to 100 times within one cycle or within a few cycles, for example ten, i.e. to values of 0.1% to 1%, a rapid loss in capacity is then present.

The advantage of this step is that a battery cell, which in all probability is damaged, is separated from a series circuit in a battery and a bypass is formed so that said battery cell is excluded from future charging and discharging processes. Due to the separation and the formation of a bypass, the danger of the damaged battery cell melting down is prevented on the one hand; and, on the other hand, the damaged battery cell is prevented from giving off heat due to overcharging or overloading, by means of which other, possibly still intact battery cells could be damaged.

The method according to the invention is advantageously implemented in such a way that a plating criterion is present if the aforementioned discharge curve has a higher discharge voltage than a known reference curve at room temperature. A discharge curve typical for the type of the battery cell or also a reference curve determined even by measurement at the battery cell can be used as the known reference curve.

Different characteristics of the discharge curve can indicate the presence of plating. The method according to the invention is advantageously implemented in such a way that a plating criterion is present if said discharge curve is characterized by a plateau. A discharge curve that has two inflection points can likewise indicate the presence of plating. The method according to the invention is therefore further advantageously implemented in such a way that a plating criterion is present if said discharge curve has at least two inflection points between two voltage intervals.

A presence of plating can furthermore be indicated if the discharge curve has a plateau, the boundaries of which lie in close proximity to the maximum of the charging voltage or respectively the minimum of the discharge voltage. The method according to the invention is therefore furthermore implemented in such a way that a plating criterion is present if said discharge curve has a plateau between two voltage intervals, wherein the delimiting voltages lie in close proximity to the maximum of the charging voltage or respectively in close proximity to the minimum of the discharge voltage.

A presence of plating can also be indicated if the discharge curve has two inflection points which lie in close proximity to the maximum of the charging voltage or respectively in close proximity to the minimum of the discharge voltage. The method according to the invention is therefore furthermore advantageously implemented in such a way that a plating criterion is present if said discharge curve has at least two inflection points between two voltage intervals, wherein the delimiting voltages lie in close proximity to the maximum of the charging voltage or respectively in close proximity to the minimum of the discharge voltage.

In a further embodiment, the change to the monitoring mode can be made dependent on the presence of a combination of a plurality of the aforementioned criteria. It is likewise possible to make the change to the monitoring mode dependent on the strength of the development of one of the aforementioned plating criteria.

Within the monitoring mode, the capacity of the battery cell is monitored in the subsequent charging and discharging cycles. To this end, a determination and recording of the electrical characteristics, i.e. the determination and recording of the capacity and/or the determination of the state of charge (SOC), takes place at predetermined intervals. These monitoring tasks can be carried out by a control and monitoring device, which is in the form of a battery management system (BMS) typically multi-celled comprising a plurality of centralized as well as decentralized components. In so doing, the monitoring tasks can for example be carried out in a centralized manner in a control unit of the BMS or also in a decentralized manner in a cell monitoring device designed, for example, solely or multiply for each battery cell or each battery module and also referred to as a cell supervision circuit (CSC). The implementation of the method according to the invention for monitoring battery cells can therefore take place by means of a CSC as well as by central components of the BMS or by both systems together. Profiles regarding the charging and discharge voltage over the charge status, in particular at room temperature, are advantageously recorded and stored in order to determine a rapid loss in capacity in in the monitoring mode.

A signal is advantageously emitted in the safety mode or during the change into the safety mode. Such a signal is suitable for signaling that one of at least a plurality of battery cells of a battery is no longer available as an energy store. Depending on the application, this can, for example, signal that the reserve of an emergency power supply has decreased or the cruising range and/or power level of a drive battery is reduced.

Subject matter of the invention is furthermore an intrinsically safe battery cell which has a storage element, a switching device and a control device which is designed to carry out a method. In so doing, the switching device is advantageously designed in the form of a half bridge, which switches the storage element of the intrinsically safe battery cell to the connection contacts in the normal and monitoring modes. In the safety mode, the storage element is, on the other hand, separated from at least one of the connection contacts and the connection contacts are directly connected to one another in accordance with a bypass.

BRIEF DESCRIPTION OF THE DRAWINGS

The invention is described below in detail with the aid of the diagrams relating to the exemplary embodiments. In the drawings.

DETAILED DESCRIPTION

Figure 1:
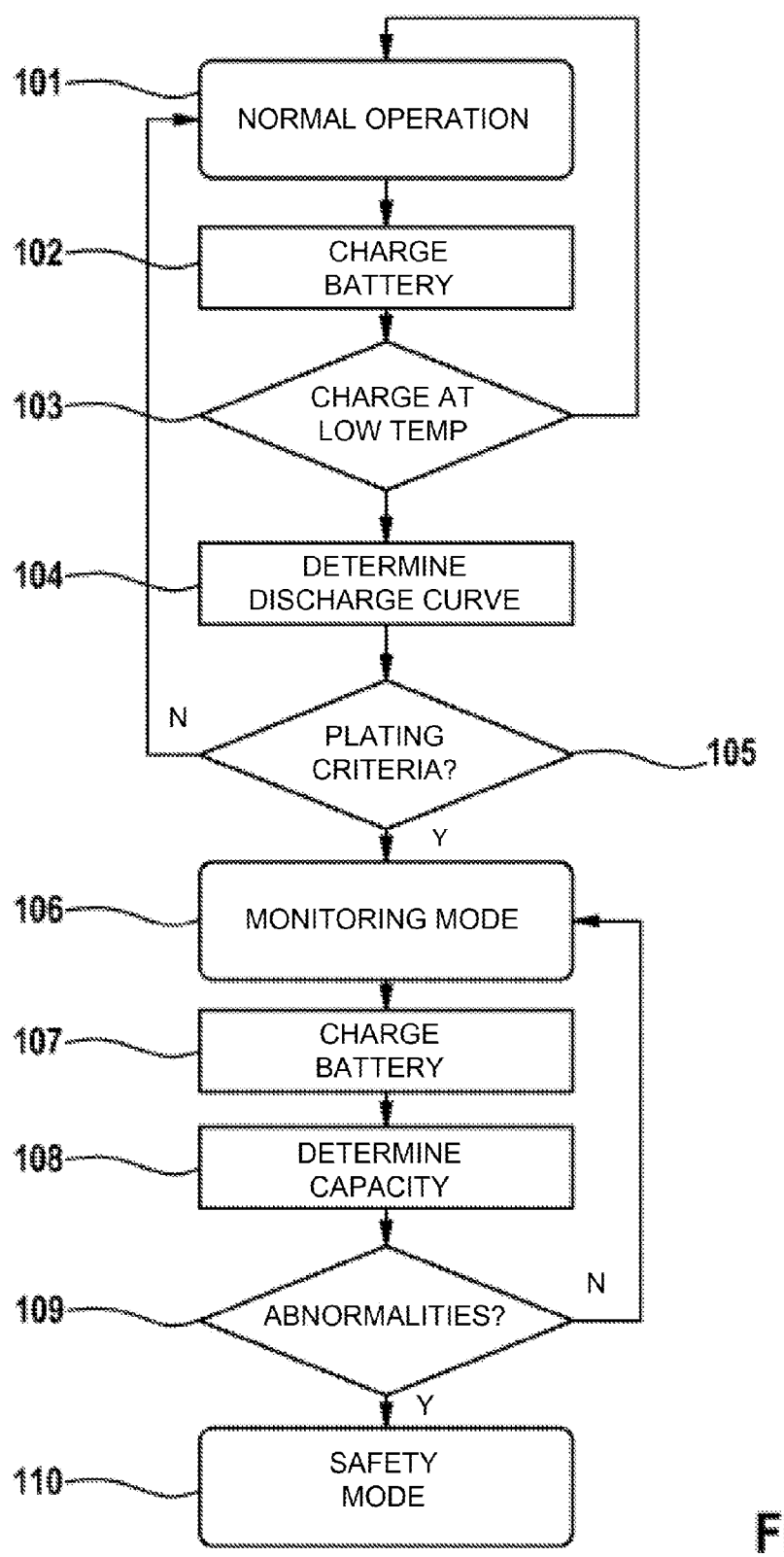
FIG. 1 shows a flow diagram for an exemplary sequence of the method.
Figure 7:
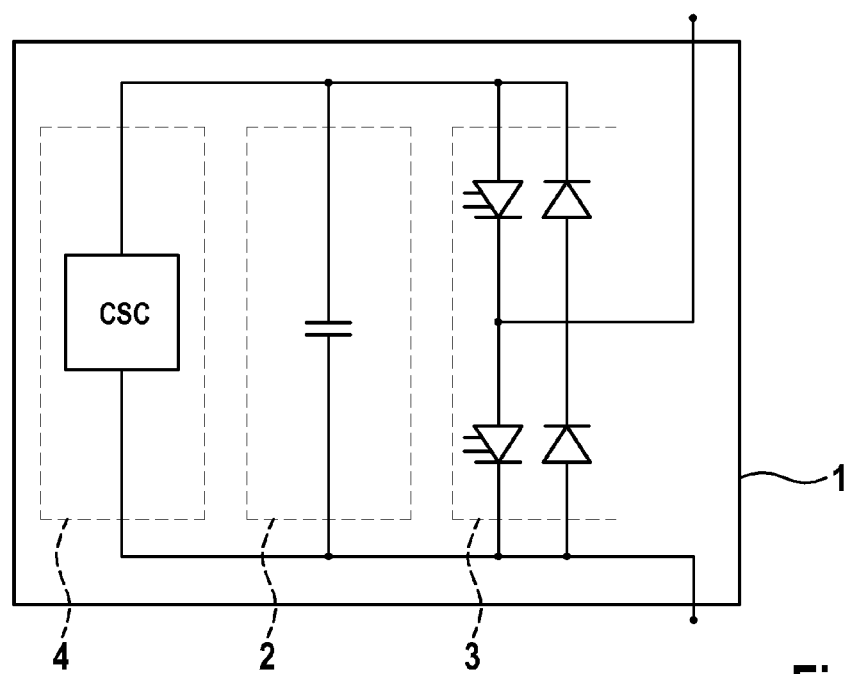
FIG. 7 shows an exemplary embodiment of an intrinsically safe battery cell.

FIG. 1 shows an exemplary embodiment of the method in the form of a flow diagram. In a normal operating mode, which is characterized in FIG. 1 by step 101, an intrinsically safe battery cell 1, which is described below in detail in relation to FIG. 7, is charged in step 102. In step 103, a check is made whether the intrinsically safe battery cell 1 was charged at a low temperature. If the intrinsically safe battery cell has been charged, for example, at room temperature a typical discharging process, which is not shown here, takes place and the method is continued at step 101 so that the intrinsically safe battery cell 1 continues to be operated in the normal operating mode and is recharged in a following cycle in step 102. If, however, the intrinsically safe battery cell 1 has been charged at a low temperature, i.e. at 0° C. or below, the discharge curve is determined during the succeeding discharging process and is analyzed in step 105 in regard to the presence of plating criteria. Provided no plating criteria were recognized, because, for example, no damage occurred to the intrinsically safe battery cell 1, the intrinsically safe battery cell 1 continues to be operated in the normal operating mode, i.e. the method is continued in step 101.

Should however a plating criterion be met, a change is made from an operation in the normal mode according to step 101 to an operation in a monitoring mode, which is depicted here as step 106. In the monitoring mode, the capacity of the intrinsically safe battery cell 1 is monitored in the following charging and discharging cycles. If the intrinsically safe battery cell is therefore charged in step 107, the capacity of the intrinsically safe battery cell 1 is determined in step 108. Profiles regarding the charging and discharge voltage over the charge status are generated and recorded, in particular at room temperature. In step 109, these profiles are, for example, compared with one another and/or with one or respectively a plurality of predefined profiles of reference curves, for example of profiles measured when the battery was brought into service. Should no abnormalities appear in this comparison in step 109, the intrinsically safe battery cell 1 is further operated in the monitoring mode and the method jumps to step 106. Should, however, a rapid loss in capacity be recognizable in this comparison, a change is made in step 110 to an operation in a safety mode in which the intrinsically safe battery cell 1 or the storage element 2 thereof is disconnected and/or a bypass is formed via the connection contacts thereof.

Figure 2:
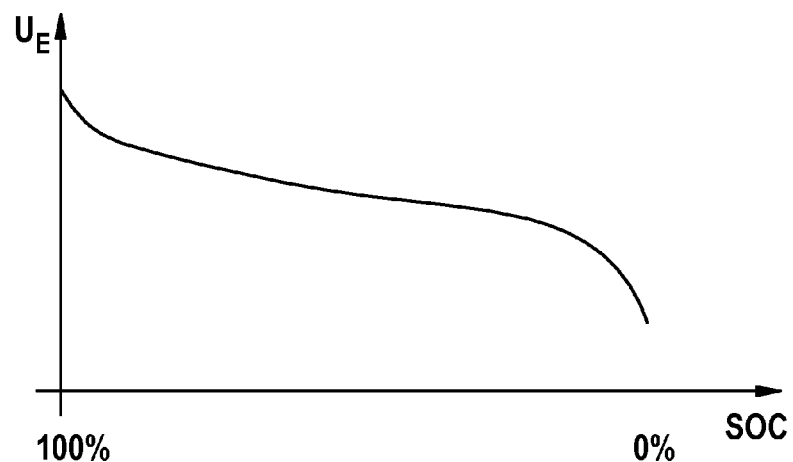
FIG. 2 shows an example of a discharge curve.

FIG. 2 shows an example of a discharge curve, in which the discharge voltage UE is plotted over the charge status (SOC). In accordance with the temporal sequence, the charge status is plotted so as to drop from 100% to 0%.

Figure 3:
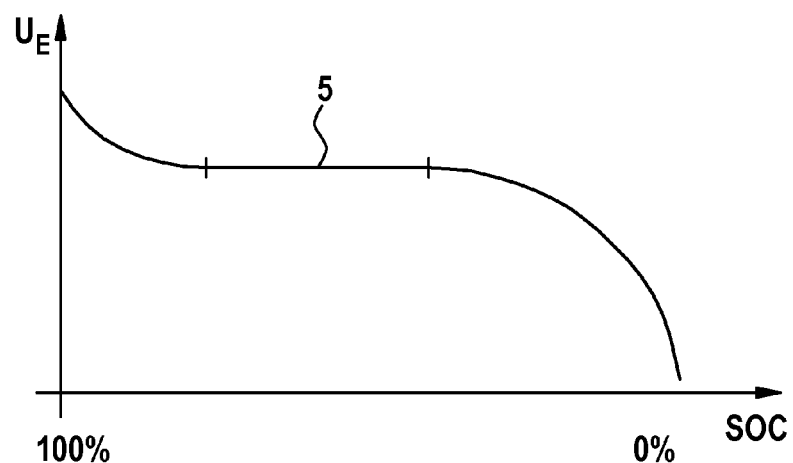
FIG. 3 shows an example of a discharge curve comprising a plateau.

FIG. 3 shows an example of a discharge curve, in which the discharge voltage UE is likewise plotted over the charge status (SOC). In contrast to FIG. 2, the discharge curve forms a plateau 5 in a section, which plateau indicates the presence of plating, i.e. a plating criterion is depicted.

Figure 4:
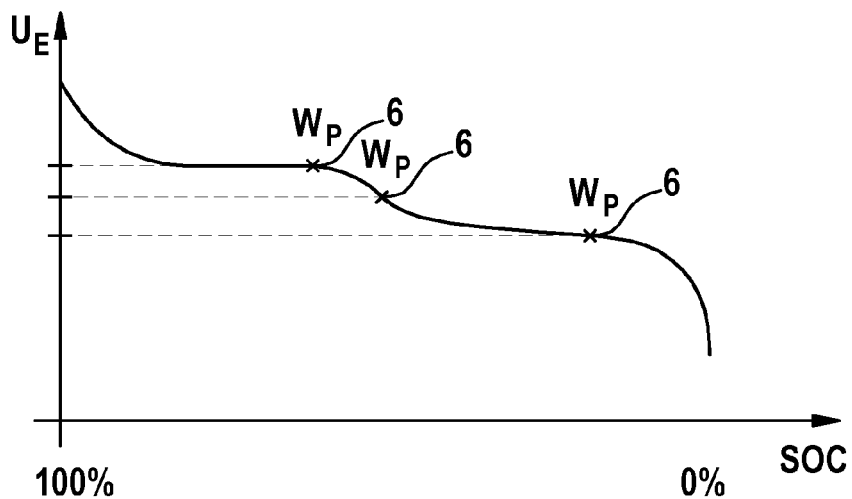
FIG. 4 shows an example of a discharge curve comprising a plurality of inflection points.

FIG. 4 shows a further example of a discharge curve, in which the discharge voltage UE is plotted over the charge status (SOC). In contrast to FIGS. 2 and 3, the discharge curve forms a plurality of inflection points 6, which likewise indicate a presence of plating, i.e. likewise depict a plating criterion.

Figure 5:
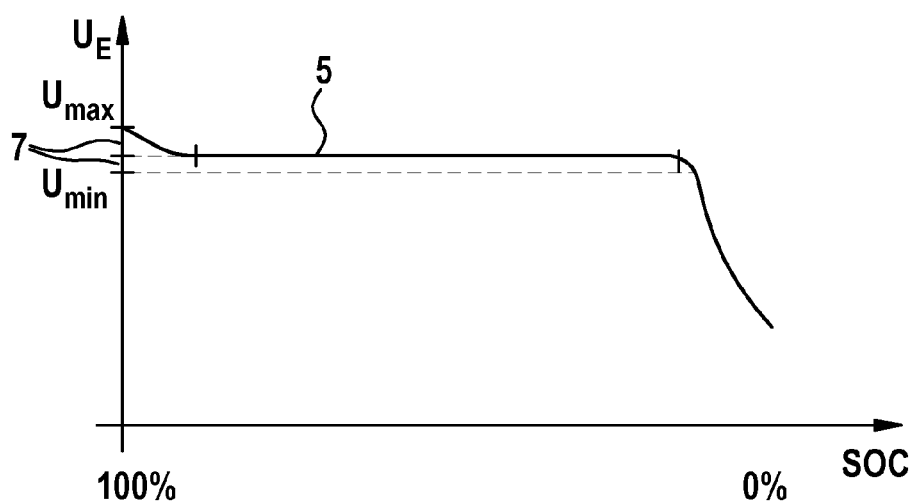
FIG. 5 shows an example of a discharge curve comprising a plateau, the delimiting voltages of which lie in close proximity to the maximum charging voltage or respectively in close proximity to the minimum discharge voltage.

FIG. 5 like FIG. 3 shows an example of a discharge curve, in which the discharge curve forms a plateau 5 between two voltage intervals 7. In contrast to FIG. 3, the delimiting voltages lie in close proximity to the maximum charging voltage or respectively in close proximity to the minimum discharge voltage.

Figure 6:
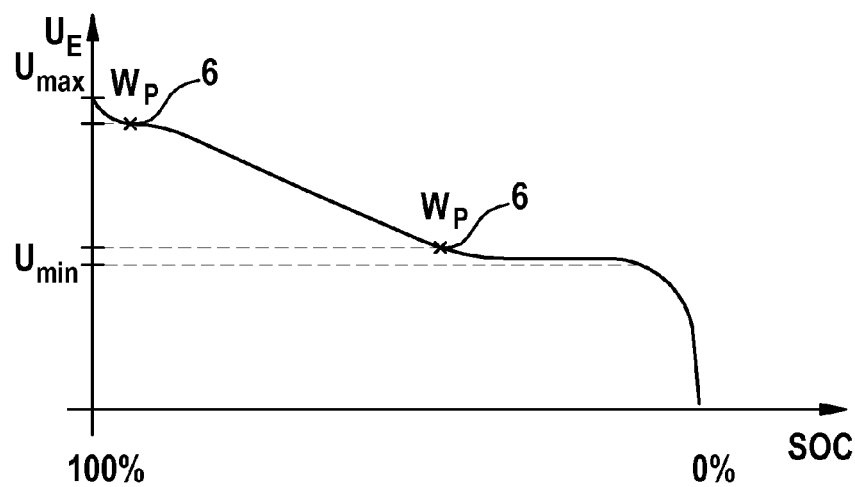
FIG. 6 shows an example of a discharge curve comprising a plurality of inflection points, the voltages of which lie in close proximity to the maximum charging voltage or respectively in close proximity to the minimum discharge voltage.

FIG. 6 like FIG. 4 shows an example of a discharge curve comprising a plurality of inflection points 6, the associated voltages of which lie in close proximity to the maximum charging voltage or respectively the minimum discharge voltage.

FIG. 7 shows an exemplary embodiment of an intrinsically safe battery cell 1, which comprises a storage element 2, a switching device 3 and a control device 4. In this case, the switching device 3 is designed as a half-bridge circuit comprising two electronic switches and free wheeling diodes. Said switching device is controlled by a control device 4 which as a monitoring circuit CSC simultaneously monitors the electric parameters of the storage element 2.

In the normal operating mode as well as in the monitoring mode, the lower of the two switches of the switching device 3 is open and the upper of the two switches is closed so that the storage element 2 is connected to the connection contacts of the intrinsically safe battery cell 1. On the other hand, the upper of the two switches is open in the safety mode so that the storage element 2 is disconnected from the connection contacts. If the intrinsically safe battery cell 1 is operated in a series circuit as is typical within a battery, the lower of the two switches is closed at the same time so that a bypass is formed and the series circuit is not interrupted.

The invention claimed is:
1. A method for operating intrinsically safe battery cells (1) after charging of an intrinsically safe battery cell (1) at a low temperature, the method comprising:
   determining a discharge curve of the intrinsically safe battery cell (1),
   analyzing the discharge curve of the intrinsically safe battery cell (1) in respect of the presence of plating criteria,
   changing operation in a monitoring mode if at least one plating criterion is present, wherein the capacity of the intrinsically safe battery cell (1) is monitored in the monitoring mode.

2. The method according to claim 1, wherein a change is made from an operation in the monitoring mode to an operation in a safety mode if a rapid loss in capacity of the intrinsically safe battery cell (1) is determined, the intrinsically safe battery cell (1) being deactivated in the safety mode.

3. The method according to claim 2, wherein profiles regarding a charging and discharge voltage over a charge status are recorded and stored in order to determine a rapid loss in capacity in the monitoring mode.

4. The method according to claim 3, wherein the profiles regarding the charging and discharge voltage over the charge status are at room temperature.

5. The method according to claim 1, wherein a plating criterion is present if said discharge curve has a higher discharge voltage than a known reference curve at room temperature.

6. The method according to claim 1, wherein a plating criterion is present if said discharge curve is characterized by a plateau (5).

7. The method according to claim 1, wherein a plating criterion is present if said discharge curve has at least two inflection points (6) between two voltage intervals.

8. The method according to claim 1, wherein a plating criterion is present if said discharge curve has a plateau (5) between two voltage intervals (7), wherein delimiting voltages lie in close proximity to a maximum of a charging voltage or respectively in close proximity to a minimum of a discharge voltage.

9. The method according to claim 1, wherein a plating criterion is present if said discharge curve has at least two inflection points (6) between two voltage intervals, wherein the delimiting voltages lie in close proximity to a maximum of a charging voltage or respectively in close proximity to a minimum of a discharge voltage.

10. The method according to claim 1, wherein a signal is emitted in a safety mode or when changing into the safety mode.

* * * * *